United States Patent [19]
Colwell et al.

[11] Patent Number: 5,760,428
[45] Date of Patent: Jun. 2, 1998

[54] VARIABLE WIDTH LOW PROFILE GATE ARRAY INPUT/OUTPUT ARCHITECTURE

[75] Inventors: Michael J. Colwell; Stephen P. Roddy. both of Fremont, Calif.

[73] Assignee: LSI Logic Corporation. Milpitas, Calif.

[21] Appl. No.: 596,894

[22] Filed: Jan. 25, 1996

[51] Int. Cl.$^6$ .................................................. H01L 27/10
[52] U.S. Cl. ........................... 257/206; 257/202; 257/203; 257/204
[58] Field of Search ................................. 257/203, 204, 257/206, 207, 208

[56] References Cited

U.S. PATENT DOCUMENTS

| | | | |
|---|---|---|---|
| 3,968,478 | 7/1976 | Mensch, Jr. .......................... 340/172.5 |
| 4,431,928 | 2/1984 | Skokan ................................. 307/465 |
| 4,600,995 | 7/1986 | Kinoshita ............................. 364/491 |
| 4,668,972 | 5/1987 | Sato et al. ............................. 357/42 |
| 4,766,475 | 8/1988 | Kawashima ......................... 257/203 |
| 4,864,381 | 9/1989 | Seefeldt et al. ...................... 357/45 |
| 4,893,168 | 1/1990 | Takahashi et al. .................. 257/203 |
| 4,910,680 | 3/1990 | Hiwatashi ............................ 364/491 |
| 4,920,398 | 4/1990 | Yoshio et al. ........................ 357/42 |
| 4,945,395 | 7/1990 | Suehiro ................................ 257/203 |
| 4,947,233 | 8/1990 | Aso ...................................... 357/68 |
| 4,975,758 | 12/1990 | Crafts ................................... 357/45 |
| 4,978,633 | 12/1990 | Seefeldt et al. ...................... 437/51 |
| 4,987,578 | 1/1991 | Akins et al. .......................... 375/121 |
| 4,988,636 | 1/1991 | Masleid et al. ...................... 437/51 |
| 4,992,845 | 2/1991 | Arakawa et al. .................... 357/42 |
| 5,019,889 | 5/1991 | Yoshio et al. ........................ 357/42 |
| 5,045,913 | 9/1991 | Masleid et al. ...................... 357/52 |
| 5,063,429 | 11/1991 | Crafts ................................... 357/40 |

(List continued on next page.)

FOREIGN PATENT DOCUMENTS

| | | | |
|---|---|---|---|
| 431490 | 6/1991 | European Pat. Off. ............. 257/203 |
| 61-208237 | 9/1986 | Japan .................................. 257/203 |
| 63-314847 | 12/1988 | Japan . |
| 64-66950 | 3/1989 | Japan . |
| 2-275653 | 9/1990 | Japan . |
| 3-138972 | 6/1991 | Japan . |
| 5-343525 | 12/1993 | Japan . |
| 6-089988 | 3/1994 | Japan . |
| 6-089989 | 3/1994 | Japan . |
| 6-77445 | 3/1994 | Japan . |

OTHER PUBLICATIONS

SGS–Thomson Microelectronics, "ISB35000 Series, HCMOS Structured Array," (Jan. 1994).

Sub–Micron Chip ESD Protection Schemes Which Avoid Avalanching Junctions, by E.R. Worley et al., EOS/ESD Symposium (1995).

Novel Clamp Circuits for IC Power Supply Protection, by Timothy J. Maloney, et al., EOS/ESD Symposium (1995).

*Primary Examiner*—Tom Thomas
*Assistant Examiner*—David B. Hardy
*Attorney, Agent, or Firm*—Hickman & Martine, LLP

[57] ABSTRACT

A gate array masterslice having a minimal input/output slot and variable pad pitch architecture is disclosed. In the masterslice, many identical input/output slots ring the periphery of a semiconductor substrate and contain only the special devices necessary for input/output circuits. Each of the input/output slots include (i) a first region containing a plurality of tuning transistors of different sizes, (ii) a second region having one or more PMOS transistors, each of a size greater than any one of the plurality of tuning transistors, (iii) a third region having one or more NMOS transistors, each of a size greater than any one of the plurality of tuning transistors, and (iv) a fourth region containing one or more devices for providing electrostatic discharge protection. One to four PMOS transistors are provided in the second slot region and one to four NMOS transistors are provided in the third slot region. A plurality of bonding pads are provided, at least some of which are electrically connected to at least some of the input/output slots such that the plurality of bonding pads may have a variable bonding pad pitch.

47 Claims, 10 Drawing Sheets

U.S. PATENT DOCUMENTS

| | | | |
|---|---|---|---|
| 5,087,955 | 2/1992 | Futami | 257/355 |
| 5,162,893 | 11/1992 | Okano | 257/203 |
| 5,291,043 | 3/1994 | Arakawa | 257/208 |
| 5,300,796 | 4/1994 | Shintani | 257/203 |
| 5,347,150 | 9/1994 | Sakai et al. | 259/203 |
| 5,365,091 | 11/1994 | Yamagishi | 257/203 |
| 5,422,441 | 6/1995 | Iruka | 174/250 |
| 5,581,202 | 12/1996 | Yano et al. | 326/101 |
| 5,610,417 | 3/1997 | Doi | 257/203 |
| 5,698,873 | 12/1997 | Colwell et al. | 257/206 |

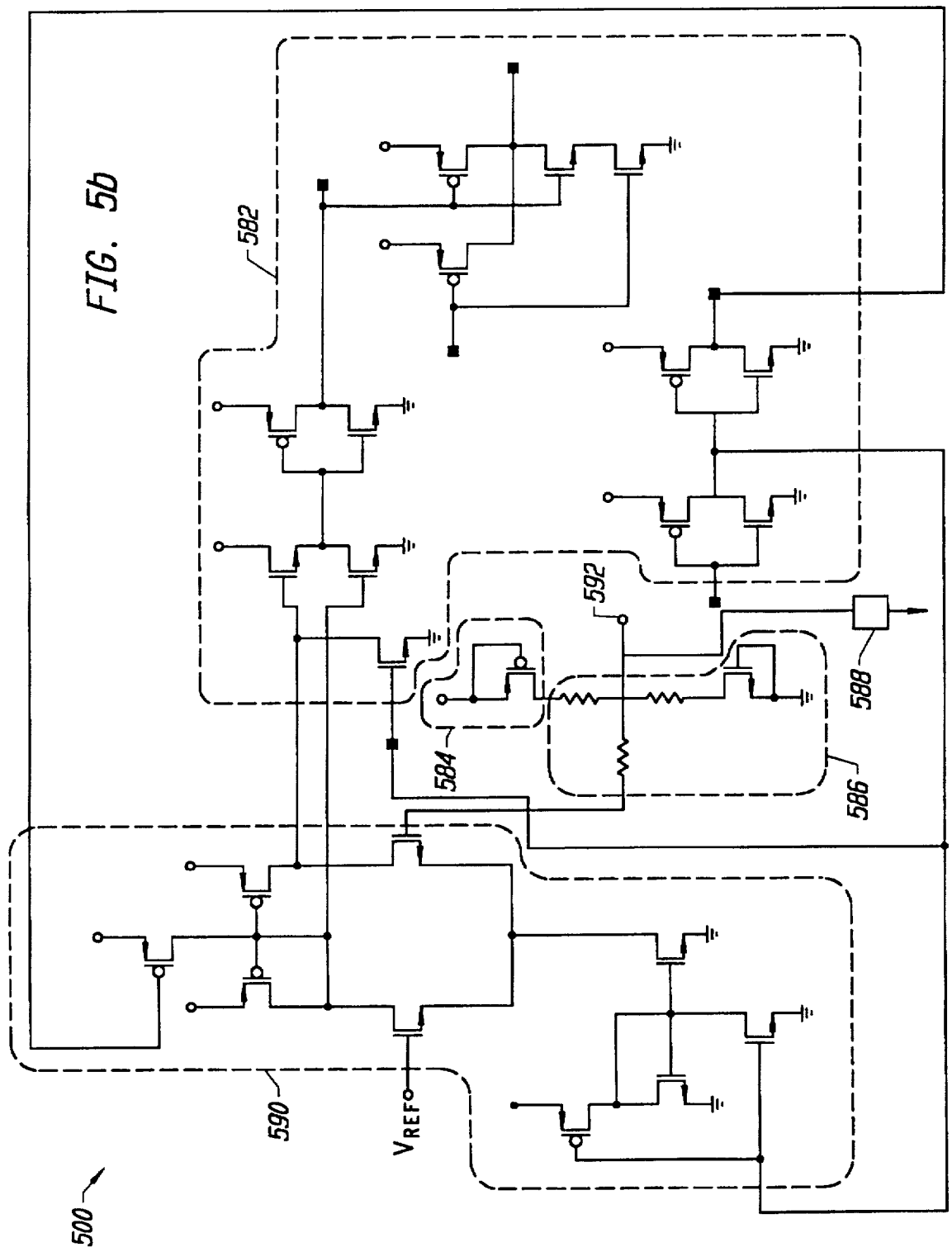

VARIABLE WIDTH LOW PROFILE GATE ARRAY INPUT/OUTPUT ARCHITECTURE

BACKGROUND OF THE INVENTION

The present invention relates generally to complementary metal oxide semiconductor ("CMOS") gate array masterslice input/output structures. More particularly, the invention relates to an input/output slot design, and an associated pad placement layout.

A gate array is a type of integrated circuit ("IC") made from an array of repeating identical base cells in a core region of a semiconductor chip. Each such base cell contains the same predetermined number and arrangement of MOS transistors. And, as in all MOS-based ICs, each such transistor includes two source/drain diffusion regions separated by a channel region in a silicon substrate, together with a gate located over the channel region. Each gate includes a thin layer of gate oxide sandwiched between a polysilicon gate electrode and the channel region of the substrate.

A gate array masterslice structure contains no prespecified circuitry, only unconnected MOS transistors which will later be wired to form circuits. Thus, a gate array design provides the flexibility to form many different types of integrated circuits—such as for example memory chips and logic chips. The ultimate design of such gate array integrated circuits is determined by the back-end processing employed (i.e., the processing to form and pattern metallization layers and thereby create wiring between the many transistors available on the underlying base cells). It is the arrangement of these interconnections that defines the circuitry present on a given gate array integrated circuit. Because of their versatility, gate arrays are widely used to make application specific integrated circuits (ASICs).

FIG. 1a shows a basic masterslice gate array structure 10 provided on a semiconductor die 23 and including a core region 24 containing an array of identical base cells such as base cell 20. As shown, the base cells are generally rectangular and are arranged in repeating rows and columns. Within each base cell, a collection of transistors (not shown) is provided. In each column of base cells within the core region 24, a first metal line 21 and a second metal line 22 span the length of the core region. Metal line 22 is used to deliver power (Vdd) to individual base cells in the column of the array, while metal line 21 provides ground (Vss) to each base cell in the column. Gate array 10 also includes Vdd metal line 18 and Vss metal line 16 ringing the core perimeter to provide power and ground to the metal lines 22 and 21.

The gate array structure 10 also includes input/output ("I/O") pads 12 and I/O slots 14 located around the perimeter of the die 23 and outside of the core region 24. These pads form the contact region for wire bonds or other electrical connections that connect the IC circuitry to external elements. The I/O slots 14 contain transistors and other devices used for interfacing with the external elements to which die 23 is connected. As shown in FIG. 1a, the I/O pads 12 are of equal size and are equally spaced apart form neighboring I/O pads. The I/O slots 14 are also of equal size. Note that the pads have a constant "pad-pitch" that is defined by a spacing 15. Typically slots 14 will—when wired—include Electrostatic Discharge (ESD) protection circuits, predrivers, drivers, input buffers, etc.

As profit margins are often dictated by the amount of silicon used in an integrated circuit, gate array designers are faced with a continuing challenge to reduce the area of the overall masterslice structure. Because many package designs locate I/O pads and slots in the chip perimeter, the minimal chip area is often limited by the space requirements of I/O regions. In such cases, any efficiency gained by reducing the core size of a given gate array integrated circuit is rendered meaningless in the face of such I/O requirements. Thus, the task of reducing masterslice area often requires reducing the I/O area.

Like the base cells of a gate array, the I/O slots of a gate array also contain a predefined number and arrangement of MOS transistors. Traditionally, the slots are designed to include as many transistors as were necessary to enable the construction of the most complex input-output circuits that could be required for a given I/O pad. Thus, each slot was expected to handle all I/O processing that any slot might potentially employ. Such slots included circuitry for electrostatic discharge protection, drivers, buffers, process/voltage/temperature compensation, etc. Unfortunately, when less complex input-output circuits are constructed on such standard I/O slots, many transistors remain unused. For example, if an I/O slot contains 20 NMOS and 20 PMOS transistors, and the input-output circuit only requires 2 NMOS and 2 PMOS transistors, 18 NMOS and 18 PMOS transistors would remain unused and take up valuable surface area.

Another problem associated with prior I/O slot designs is the possible misalignment of pads to slots. For example, some companies offer gate arrays with multiple pad pitches. For larger pad pitches, there are more slots available than there are pads. For each pad pitch, a pad to slot ratio is chosen, and a slot is designated for each pad. In most cases, the slots no longer line up directly with the pads, and for some slot/pad combinations, the misalignment is such that the width of the wires between the pad and the slot becomes quite small.

FIG. 1b shows a typical prior art I/O slot and pad arrangement 50 in which individual I/O slots 52a–52d do not line up directly with individual I/O pads 54a–54c. As shown, I/O slots 52a–52d have a constant width 51 and height 53. Further, I/O pads 54a–54c are located below the I/O slots, and are spaced from each other by a constant pad pitch. As can be seen, I/O pad 54a does not directly line up with I/O slot 52a, and the connecting line 59a must be laid out at an angle 58. However, should angle 58 increase beyond a critical value, the connecting line must assume an elbow shape as shown in line 59b. When such elbow-shaped lines are required, the width of the connecting wire must be decreased to conform with the pertinent design rules which require specified distances between neighboring I/O slot 52c and I/O pad 54b. Unfortunately, such strictures compromise the connecting line's reliability and current carrying capabilities.

In some cases, the slot-pad angle is so great that designers must skip slots, leaving the transistors and other devices in such slots completely unused. For example, slot 52c would be unused in the design 50. This, of course, exacerbates the inefficiency caused by excess substrate area being set aside for I/O functions.

Evolving I/O designs have introduced yet another problem. Even though I/O slots have been traditionally designed to include devices for all possible I/O circuits, some gate arrays now employ rather large buffers such as Gunning transceiver logic (GTL) circuits which require more drive than is available in even a large I/O slot. Thus, multiple slots must sometimes be used with a single pad—resulting in more unused area and sometimes unusable pads. If, for example, a buffer requires 21 NMOS drivers and there are only 20 available in one slot, a complete second slot must be used, resulting in 19 unused NMOS drivers as well as the whole predriver area. Further, if the neighboring pad is assigned one of the two slots that must be used to accommodate the buffer, that pad may be unusable.

In view of the above-described difficulties associated with I/O slot designs in gate arrays, it would be desirable to provide an I/O architecture that allows for more efficient utilization of I/O slots and provides more efficient I/O pad placement.

SUMMARY OF THE INVENTION

The present invention fills these needs by providing a gate array masterslice having an I/O slot region designed to allow a variable pad pitch. In accordance with this invention, the I/O slots are minimally sized and include the following contiguous regions: a special size transistor region, a PMOS transistor region, an NMOS transistor region, and an ESD protection region. To attain a reduced slot height and width, some predrivers and/or logic circuitry may be shifted out of the I/O slot region and into the core region. By employing minimally sized I/O slots, the corresponding I/O pads may be placed arbitrarily around the periphery of the masterslice to avoid excessive angles between pads and I/O slots and to increase I/O device utilization.

In one aspect of the present invention, a gate array masterslice is formed on a semiconductor substrate; the gate array masterslice comprises a plurality of identical input/output slots. Each of the input/output slots have a first region containing a plurality of tuning transistors of different sizes, a second region having one or more PMOS transistors, each of a size greater than any one of the plurality of tuning transistors, a third region having one or more NMOS transistors, each of a size greater than any one of the plurality of tuning transistors, and a fourth region containing one or more devices for providing electrostatic discharge protection. A plurality of bonding pads are provided, at least some of which are electrically connected to at least some of the input/output slots such that the plurality of bonding pads have a variable bonding pad pitch. In this design, the first region, the second region, the third region and the fourth region are contiguous to one another.

In another aspect of the present invention a gate array masterslice formed on a semiconductor substrate comprising a core region having a plurality of identical base cells, and a plurality of identical input/output slots, each of which have: (i) a first region adjacent the core region and containing a plurality of tuning transistors of different sizes; (ii) a second region adjacent to the first region, and containing at most four PMOS transistors, each of a size that may be greater than any one of the plurality of tuning transistors; (iii) a third region adjacent to the second region, and containing at most four NMOS transistors, each of a size that may be greater than any one of the plurality of tuning transistors; and (iv) a fourth region adjacent to the third region, and containing one or more devices for providing electrostatic discharge protection. The gate array masterslice also includes a plurality of bonding pads, at least some of which are electrically connected to at least some of the input/output slots. As in the previous aspect, the first region, the second region, the third region and the fourth region are contiguous with one another.

In yet another aspect of the present invention a gate array masterslice is formed on a semiconductor substrate, comprising a core region having a plurality of identical base cells, each of which contains multiple transistors of no more than a defined gate length and no more than a defined gate width. A plurality of identical input/output slots are provided, each of which have: (i) a first region adjacent to the core region, and containing a plurality of tuning transistors of different sizes; (ii) a second region adjacent to the first region, and having one or more PMOS transistors, each of a size greater than any one of the plurality of tuning transistors; (iii) a third region adjacent to the second region, and having one or more NMOS transistors, each of a size greater than any one of the plurality of tuning transistors; and (iv) a fourth region adjacent to the third region, and containing one or more devices for providing electrostatic discharge protection. The masterslice also includes a plurality of bonding pads, at least some of which are electrically connected to at least some of the input/output slots. In this aspect of the invention, each transistor in the first, second, and third regions of the input/output slots has either (i) a gate width that is greater than the defined gate width, (ii) a gate length that is greater than the defined gate length, or (iii) both. As before, the first, second, third and fourth regions are contiguous with one another.

In still another aspect of the present invention, a method of fabricating a gate array masterslice formed on a semiconductor substrate is provided. The method comprises the steps of forming a plurality of identical input/output slots on the semiconductor substrate. Each of said input/output slots is made by: (i) forming a first region containing a plurality of tuning transistors of different sizes; (ii) forming a second region having one or more PMOS transistors, each of a size greater than any one of said plurality of tuning transistors; (iii) forming a third region having one or more NMOS transistors, each of a size greater than any one of said plurality of tuning transistors; (iv) forming a fourth region containing one or more devices for providing electrostatic discharge protection. Then the method also includes a step of forming a plurality of bonding pads separated from one another by a variable pad pitch, with the first, second, third and fourth regions being formed contiguous with one another.

The features and advantages of this invention will be further described below in the detailed description with reference to the associated figures.

BRIEF DESCRIPTION OF THE DRAWINGS

FIG. 5b is a transistor level diagram of a differential input circuit divided into circuit blocks is constructed on specified I/O slot regions of the present invention.

DETAILED DESCRIPTION OF THE PREFERRED EMBODIMENTS

1. Input-Output Slot and Pad Architecture

Figure 2A:
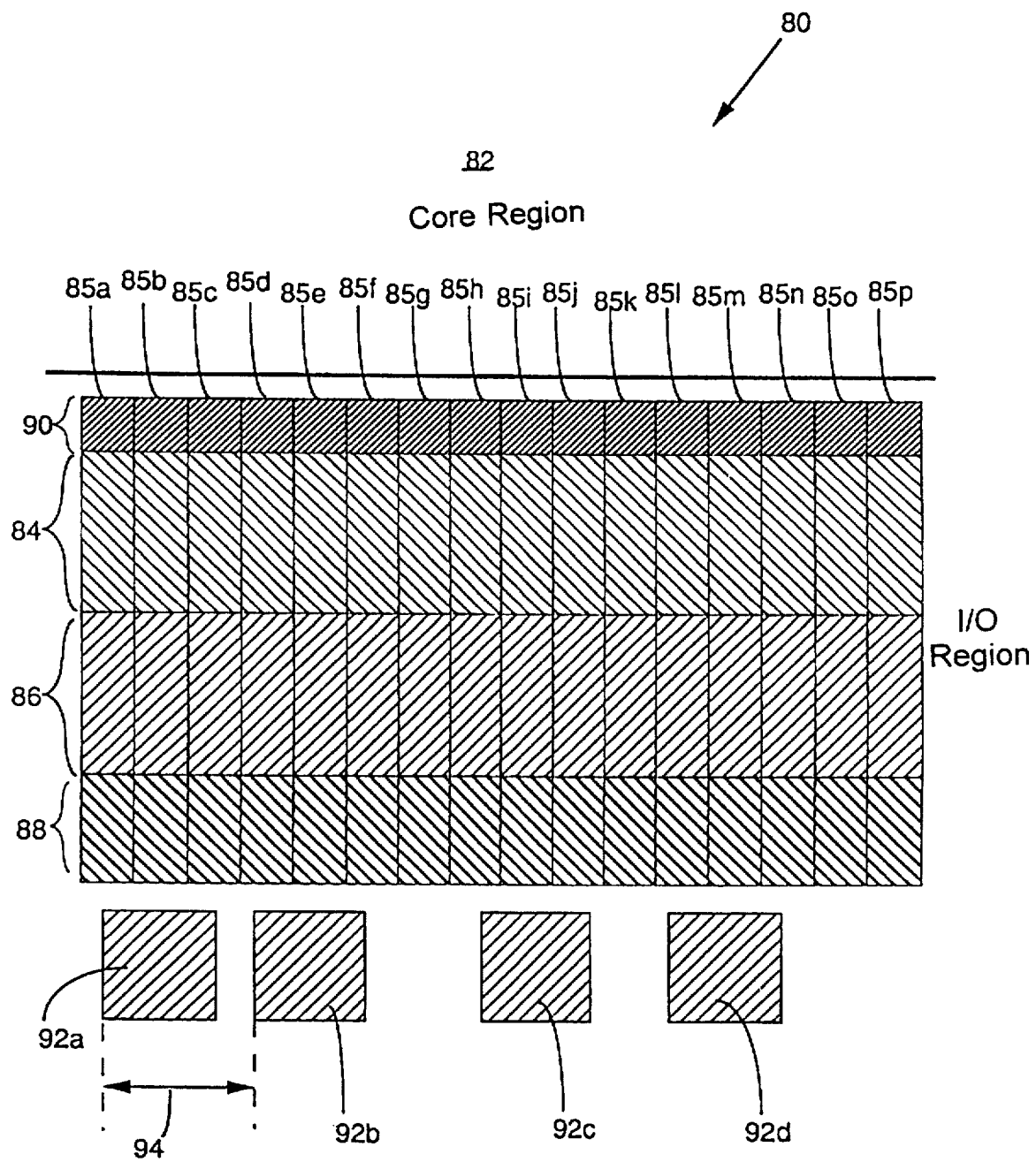
FIG. 2a is an illustration of the input-output architecture of the present invention having a plurality of narrow slots and a variable pad pitch arrangement.

The structure and use of a gate array masterslice I/O design of the present invention will now be described with reference to FIGS. 2 through 5b. FIG. 2a is an illustration of the input-output architecture 80 of the present invention having a plurality of narrow I/O slots 85a–85p and a variable pad pitch arrangement. A core region 82 is shown located above the plurality of I/O slots. The plurality of I/O slots 85a–85p are divided into four regions.

A first region is a special size transistor region 90 where a variety of differing width and length tuning transistors are located. A second region and a third region are PMOS and NMOS transistor regions 84 and 86 respectively. The PMOS transistor and the NMOS transistor regions 84 and 86 generally consist of larger width and length transistors than those located in the core region 82 or the special size transistor region 90. A fourth region is an ESD region 88 which provides, as is well known to those skilled in the art, electrostatic discharge protection to the various internal active devices. In the preferred embodiment, different size transistors are located in the various I/O regions, and as is well known in the art, transistor current carrying capabilities are proportionally related to transistor size.

Also shown in FIG. 2a are pads 92a–92d separated from one another by a variable pad pitch (i.e., varying "pad-to-pad" spacing). Preferably, the pad pitch can vary arbitrarily from pad-to-pad along any region of the masterslice. This allows considerable flexibility to efficiently interconnect I/O pads and input/output circuit slots. However, in all cases a minimum pad pitch 94 design rule for wire bonding should not be violated.

It is assumed that many of the pads employed on the gate array will have multiple associated slots in order to form the necessary I/O circuitry. Thus, no attempt is made to engineer the slots such that they include most or all of the I/O functionality expected for a single slot. The pad spacing may thus be dictated by the number of standard I/O slots utilized for a given I/O function. For example, one pad requiring an I/O buffer may be centered between two standard I/O slots necessary to implement the buffer, and an adjacent pad requiring an output driver may be centered between the next two I/O slots necessary to implement the driver, while the next adjacent pad requiring a receiver is centered between the next four I/O slots necessary to implement the receiver. In this manner, the pad pitch can vary "arbitrarily" from pad-to-pad depending only on the circuit requirements of the individual pads.

In alternative embodiments, the package design or other constraints may limit the pad pitch such that it does not vary or it varies only between different sections of the gate array masterslice (e.g., one side of the masterslice is set at one pad pitch and another side of the masterslice is set at a different pad pitch). In such cases, the slot(s) associated with each pad must be carefully chosen to ensure an efficient layout.

In yet another embodiment, the I/O pads may be arranged around the I/O slot parameter such that multiple staggered rows are formed. In such a formation, the pad pitch of each row may retain the aforementioned arbitrary pad-to-pad spacing. However, in this embodiment, each additional input/output pad row is staggered with respect to the other. In this manner, considerable flexibility in matching slots to an available pad location can be achieved.

Figure 2B:
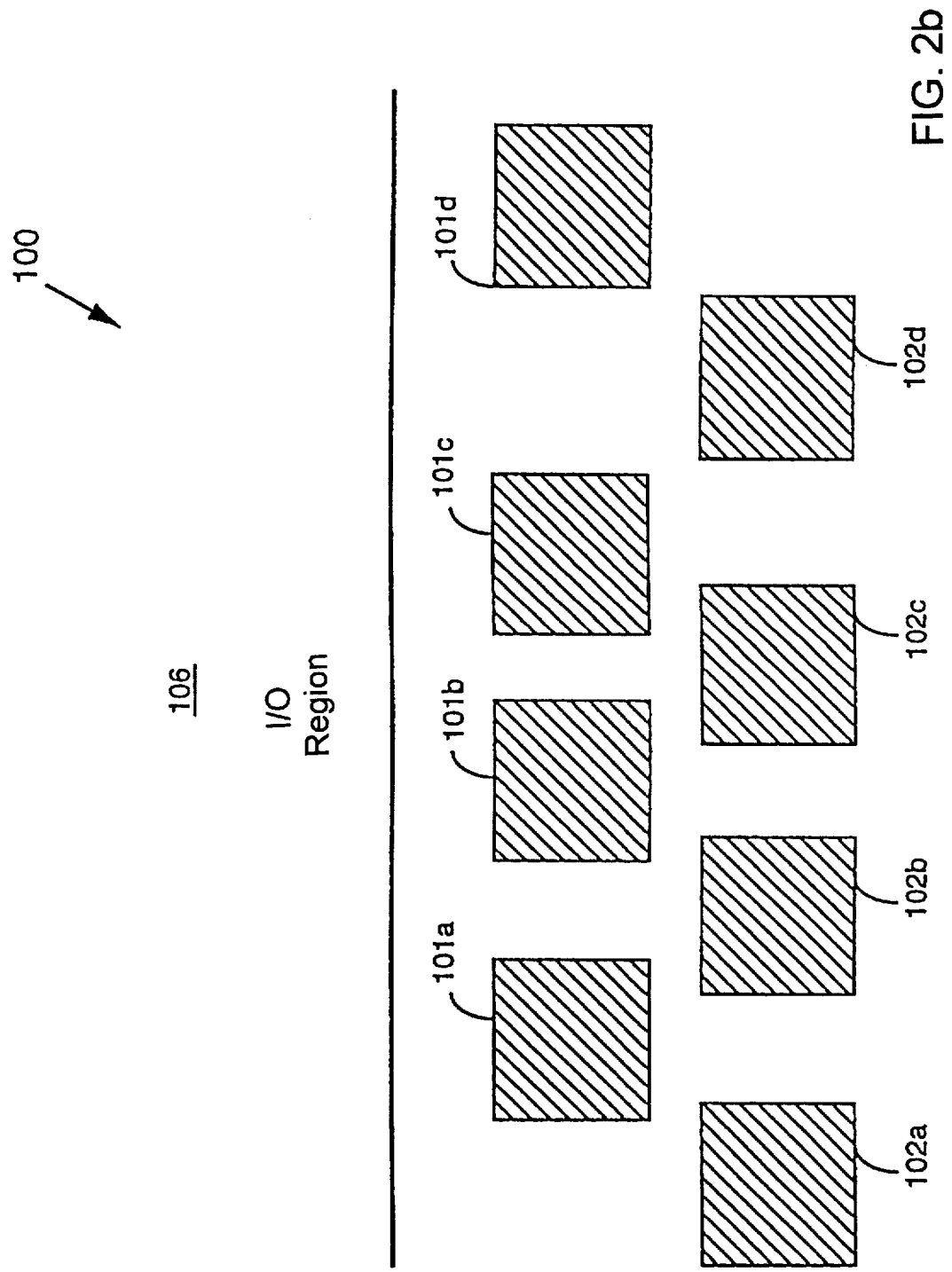
FIG. 2b is an illustration of a staggered I/O pad formation.

Briefly turning to FIG. 2b, a pad arrangement 110 having such multiple staggered rows is shown. For example, I/O region 106 may consist of a number of I/O slots as described with reference to FIG. 2a. A first row of pads 101a–101d are arranged closest to I/O region 106. Also shown is a second row of pads 102a–102d placed parallel to the first row of pads. The second row of pads 102a–102d are preferably placed such that any second row I/O circuitry will reach I/O region 106 without short circuiting any I/O circuitry associated with pads 101a–101d. Although only two rows of pads have been illustrated, it should be understood that any number of rows may be implemented.

The present invention provides design criteria which tend to reduce the profile of the individual slots. Thus, in accordance with this invention, it is generally desirable to minimize the number of transistors (and other devices) located in the individual slots. Such designs have the advantage of reducing the amount of silicon used in a given gate array design. By increasing the number of slots, a higher transistor utilization will result in the I/O region and the size of that region can be reduced.

Turning back to FIG. 2a, the transistors in I/O slots are ultimately wired to form buffers, drivers, predrivers, input receivers, various other logic circuits, etc. As such I/O circuits sometimes require larger and/or special size transistors, the present invention provides slots containing such transistors in the first, second, and third regions 90, 84, and 86. However, many I/O circuits also require some amount of impedance matching, predriver, and/or logic functionality (e.g., flip flop circuits for latching data at the input or output) that does not require large or special size transistors. The present invention reduces the slot size by providing slots that contain only larger and special size transistors (in addition to any transistors required for ESD). Thus, it is contemplated that gate array designs employing the slot/pad architecture of this invention will move most impedence matching, predriver, and logic circuitry from the I/O slots 85a–85p to the core region 82. Such circuitry is simply constructed on core region base cells located proximate the corresponding I/O slots associated with pads requiring the circuitry. In general, any I/O circuitry not requiring large on special size transistors can be formed in the core region. Drivers, buffers, differential inputs, gunning transceiver logic circuits ("GTLs"), etc. that require larger transistors will typically retain much of their functionality in the PMOS region 84, the NMOS region 86, and the tuning transistor region 90.

Because the present invention removes some predriver and logic circuitry from the slots, it reduces the slot height and width which, in turn, allows for smaller masterslice systems. Further, fewer slot transistors are wasted, and more efficient input/output circuit placement can be achieved.

The special size transistors in region 90 include transistors of various widths and lengths. A plurality of different width and length transistors are used for certain tuning input-output circuits built on slots 85a–85p. For example, GTL circuits and differential input circuits require special size transistors 90. In one embodiment, the special size transistors 90 may comprise about 5 to 6 transistors having gate lengths in the range between about 0.5 μm to 4.0 μm and gate widths ranging from about 1.2 μm to about 12 μm. In another embodiment, the special size transistors 90 may comprise ten transistors having a constant length of about 0.4 μm and varying widths ranging between about 0.8 μm to about 10

μm. In general, however, the transistors in region 90 should be larger than transistors in the core region, but smaller than the transistors in the PMOS and NMOS regions 84 and 86.

The ESD region 88 is provided to protect internal circuits as well as other I/O circuitry from unexpected voltage surges. Any conventional ESD protection device/circuitry may be employed for this purpose. Preferably, however, the ESD devices occupy a relatively small area, as the minimum slot size is typically limited by the ESD structure size. Examples of conventional ESD structures and circuits implemented in today's technology include, for example, current shunt circuits using forward biased diodes and/or parasitic bipolar Semiconductor Controlled Rectifiers (SCR). Another type of ESD protection utilizes a special n-p-n junction Field Effect Transistor (FET) that sinks current to ground upon an ESD event. Such devices are intended to avalanche when they receive an unexpected high breakdown voltage (i.e., an ESD event).

Another form of ESD protection that can be implemented with the present invention includes power supply protection devices generally positioned between the power and ground lines on the masterslice. This has the advantage that the ESD regions 88 of the I/O slots will only include diodes. Thus, slot widths can be decreased since they are not limited by a collection of larger devices normally employed in conventional ESD protection systems. During an ESD event on an I/O pad, this form of ESD protection causes current to travel from the diodes to the power supply protection device. For more information on ESD protection schemes, reference may be made to one of the following articles. One article is entitled *Sub-Micron Chip ESD Protection Schemes Which Avoid Avalanching Junctions*, by E. R. Worley et al., EOS/ESD Symposium (1995). Another article is entitled *Novel Clamp Circuits for IC Power Supply Protection*, by Timothy J. Maloney, et al., EOS/ESD Symposium (1995).

As noted, a primary factor in determining the width of I/O slots 85a–85p is the width requirements of the ESD circuitry used. Hence, gate arrays using complex, space intensive ESD circuitry generally require rather wide I/O slots. In such cases, the slots will include more PMOS transistors 84 and NMOS transistors 86 than are minimally necessary for practice of this invention.

Figure 3A:
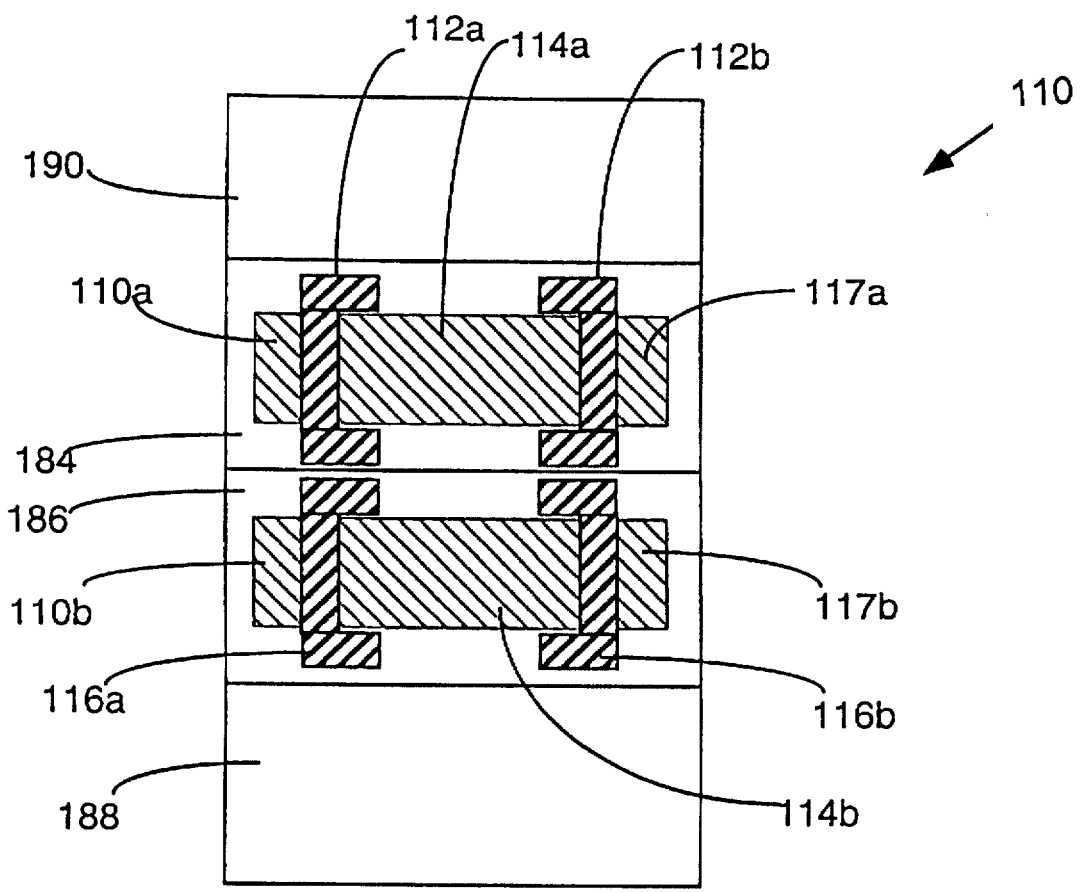
FIG. 3a is an illustration of an I/O slot of this invention having two NMOS transistors and two PMOS transistors.

FIG. 3a shows an exemplary single I/O slot 110 of this invention having an ESD region 188, a special size transistor region 190, a PMOS transistor region 184, and an NMOS transistor region 186. The PMOS transistor region 184 has two PMOS transistors connected in series and having gate electrodes 112a and 112b separating source/drain diffusion regions 111a, 114a, and 117a. The NMOS transistor region 186 has two NMOS transistors connected in series and having gate electrodes 116a and 116b separating three source/drain diffusion regions 111b, 114b, and 117b. I/O slot 110 is of a relatively narrow profile having only two transistors in each of the large transistor regions 184 and 186. Having narrower standard I/O slot widths, allows for more flexible I/O circuit placement around the periphery of the gate array masterslice, and also avoids having wasted I/O slots, or partially occupied I/O slots. In one embodiment, the PMOS gate electrodes 112a and 112b have a gate width of between about 20 and 40 μm and a gate length of between about 0.4 and 0.5 μm, and the NMOS gate electrodes 116a and 116b have a gate width of between about 20 and 40 μm and a gate length of between about 0.4 and 0.5 μm. Generally, the transistors in the PMOS transistor region 184 and the NMOS transistor region 186 are about 2 to 4 times larger than the transistors in the core region. Further, all transistors in region 184 are of the same size, as are all transistors in region 186.

Figure 3B:
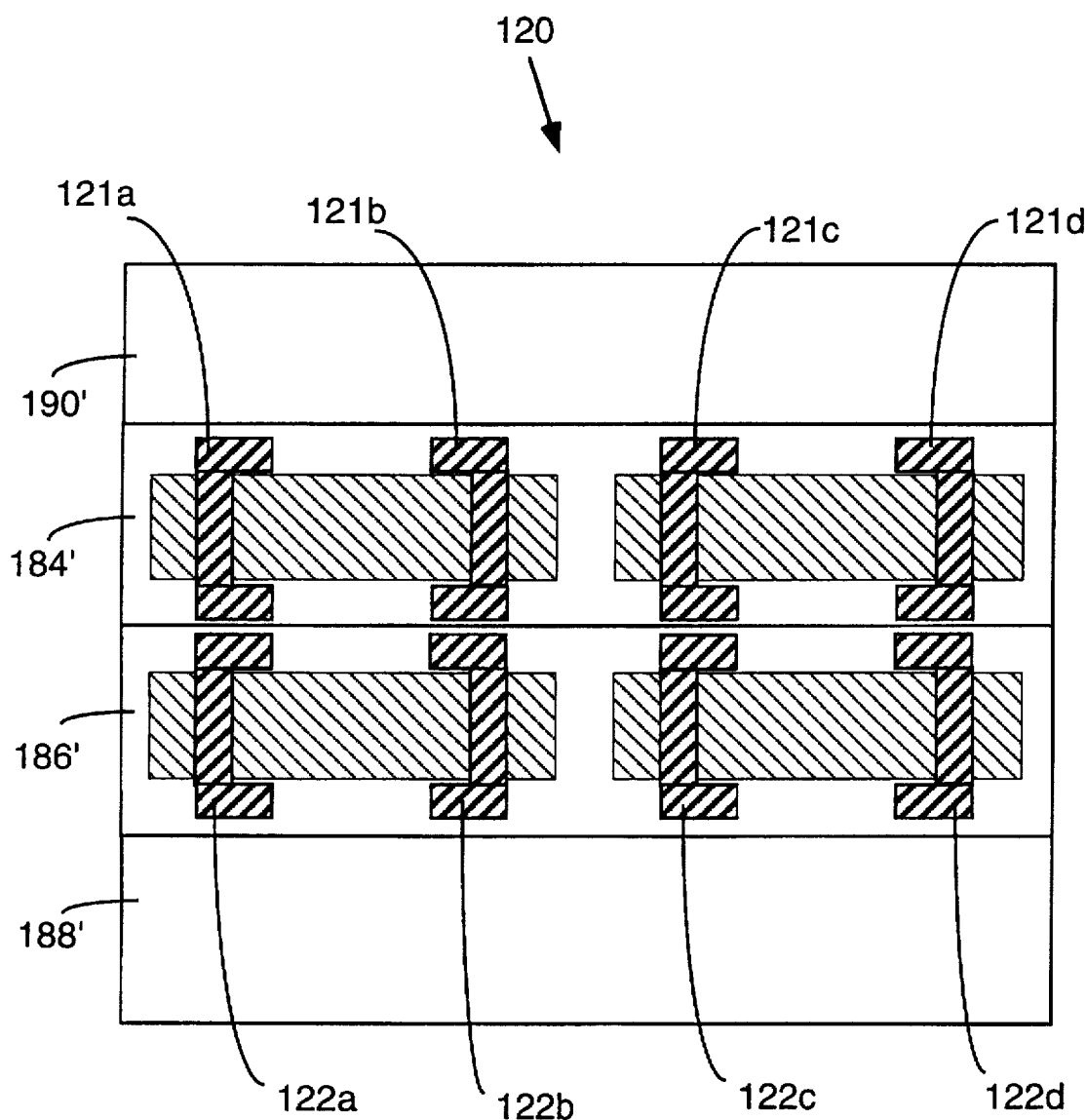
FIG. 3b is an illustration of an I/O slot of this invention having four NMOS transistors and four PMOS transistors.

As noted, the ESD requirements (or some other requirement) may force the gate array design to be larger than optimal. FIG. 3b illustrates how the transistor layout of such a non-minimal width I/O slot 120 could be configured. I/O slot 120 is shown having two pairs of PMOS transistors (denoted by individual transistors 121a–121d), and two pairs of NMOS transistors (denoted by individual transistors 122a–122d). Each pair of PMOS and NMOS transistors also share a common source/drain diffusion region as discussed with reference to FIG. 3a. Although it is within the purview of this invention to employ even wider I/O slots (e.g., 6 PMOS/6 NMOS, 8 PMOS/8NMOS, 10 PMOS/10 NMOS... etc.), it is in keeping with a goal of this invention to limit the standard I/O slot width, since a narrower standard I/O slot allows for more flexible input-output circuit placement, and fewer wasted transistors.

Figure 4A:
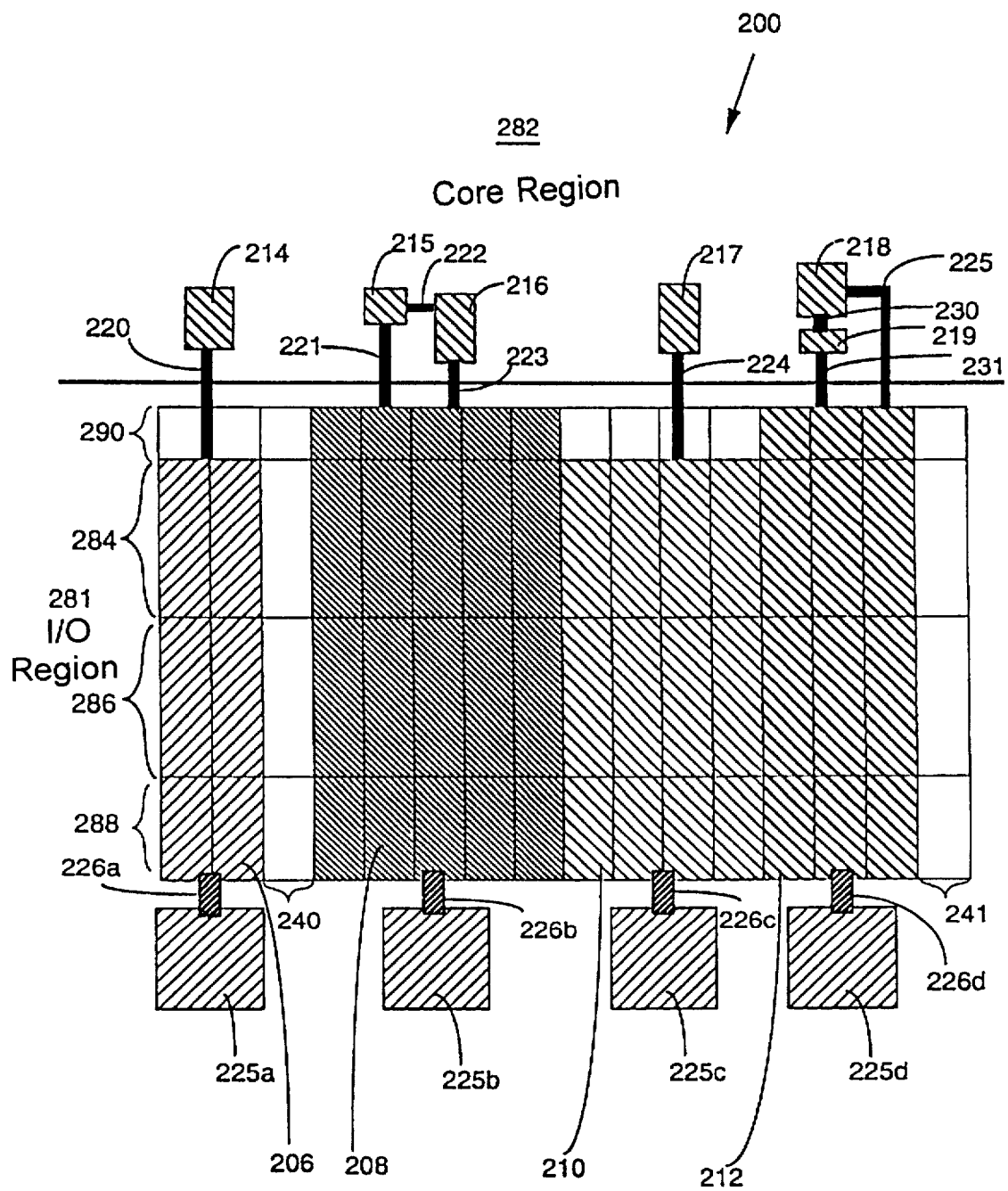
FIG. 4a is an illustration of the I/O architecture of the present invention showing regions dedicated to various input output circuits.

FIG. 4a is an illustration of an I/O architecture 200 of the present invention having various input-output circuits constructed thereon. As shown, four input-output circuits—an input buffer 206, GTL 208, driver 210, and differential input 212—are distributed formed on standard I/O slots of this invention. As before, the standard I/O slots have a special size transistor region 290, a PMOS transistor region 284, an NMOS transistor region 286, and an ESD region 288.

Focusing first on input buffer 206, only two standard I/O slots are being utilized, and a block 214 located in a core region 282 signifies I/O predriver and/or logic circuitry that has been shifted out of the I/O region 281 and into the core region 282. Such circuitry does not require the larger and special size transistors of regions 284, 286, and 290, and therefore can be implemented on the smaller transistors found in the core region. Generally, input/output circuits requiring "core size" transistors can be moved into the core region base cells and out of the I/O region. In the preferred embodiment, exemplary circuit elements that are moved into the core comprise predrivers and logic circuitry. Thus, a wire connection 220 electrically couples the core region predriver and/or logic circuitry to the I/O slots containing the remainder of the input buffer circuitry. As indicated above, the input-output circuitry that is shifted into the core region 282 is typically constructed on core region base cell transistors located near the masterslice periphery, proximate the I/O slot to which it is electrically coupled. As illustrated in FIG. 4a, no transistors from the special size transistor region 290 were utilized by input buffer 206.

The next input-output circuit is GTL 208 which is shown utilizing five standard I/O slots, and also utilizing transistors from the special size transistor region 290. Blocks 215 and 216 located in the core region 282 also signify predrivers and/or logic circuitry that has been shifted out of the I/O region 281. Wire connections 222, 221 and 223 provide electrical connection to the appropriate GTL 208 circuit segments. As shown, the input-output predriver and/or logic circuitry shifted from the I/O region 281 is constructed in the core region proximate to the slots containing the remainder of the GTL 208 input-output circuitry. Adjacent to GTL 208 is a driver 210, which utilizes four standard I/O slots.

Unlike GTL 208, driver 210 uses no transistors from the special size transistor region 290. Block 217 represents circuitry that has been shifted out of the I/O region 281. Wire connection 224 electrically connects the core region circuitry to the remainder of driver 210. Adjacent to driver 210, is differential input 212 shown occupying three standard I/O slots, and utilizing transistors from the special size transistor region 290. As in the other input-output circuits, blocks 218 and 219 represent appropriate circuitry that has been shifted from the I/O region 281 to the core region 282. Also shown are the wire connections 225, 230 and 231 which provide electrical connection from the core region 282 to the slot region circuitry of differential input 212.

FIG. 4a also shows I/O pads 225a–225d having a variable pad pitch. In particular, pad 225a connects to input buffer 206 via wire connection 226a. Pad 225b connects to GTL 208 via wire connection 226b. Pad 225c connects to driver 210 via wire connection 226c. Pad 225d connects to differential input 212 via wire connection 226d. By allowing the pad pitch to vary arbitrarily, the present invention provides the flexibility necessary for placing an I/O pad directly below the set of standard I/O slots associated with the input-output circuit appropriate for the pad.

The particular design illustrated in FIG. 4a contains two unused standard I/O slots 240 and 241 (separated by 12 utilized slots). However, because the present invention employs small I/O slots and allows for variable pad pitch, the design of FIG. 4a can be modified only slightly to make use of the extra two slots for an additional pad and associated I/O circuitry.

Figure 1A:
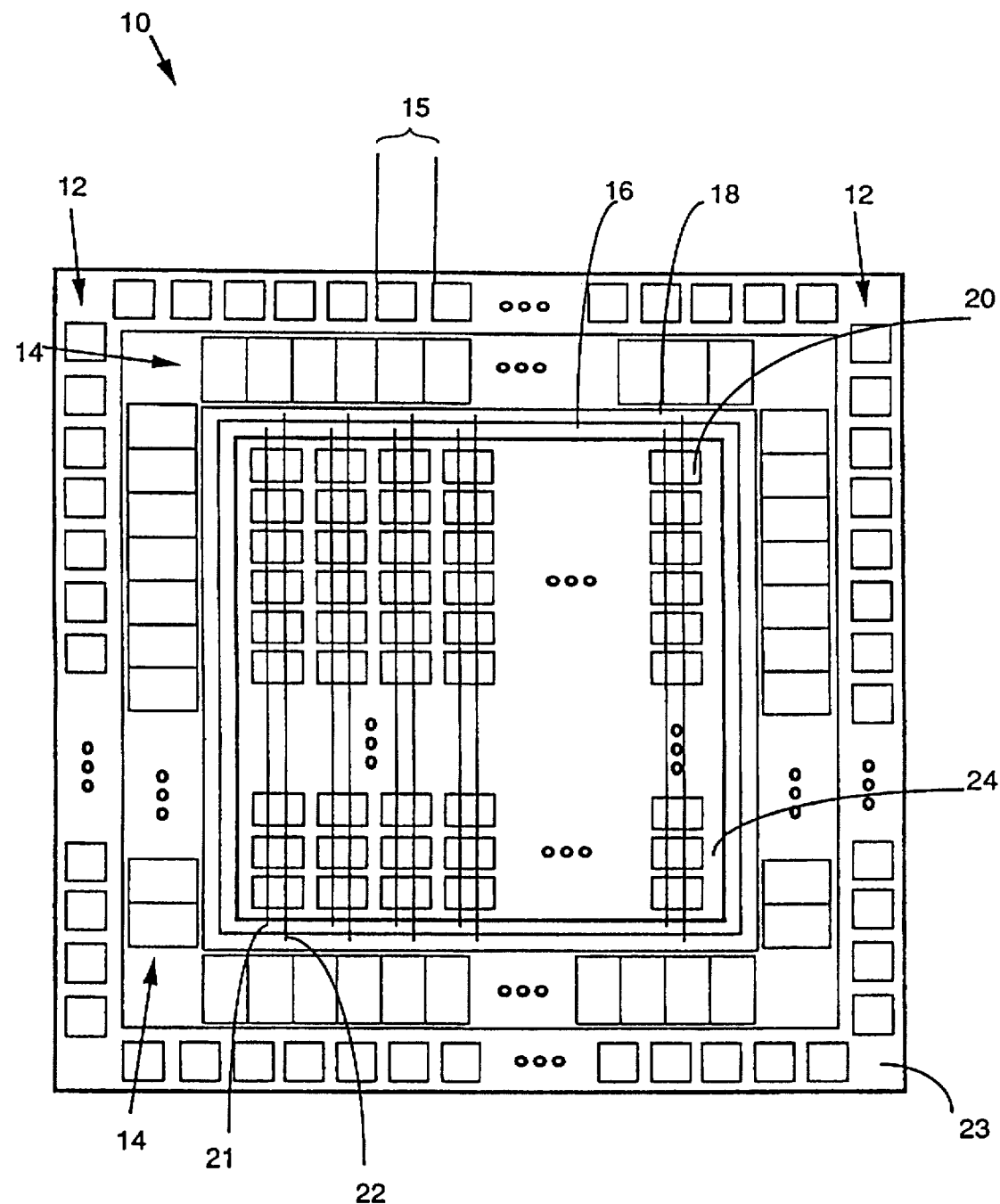
FIG. 1a is an illustration of a conventional gate array masterslice containing an array of repeating base cells in a core region, and a plurality of I/O slots and pads ringing the periphery.
Figure 1B:
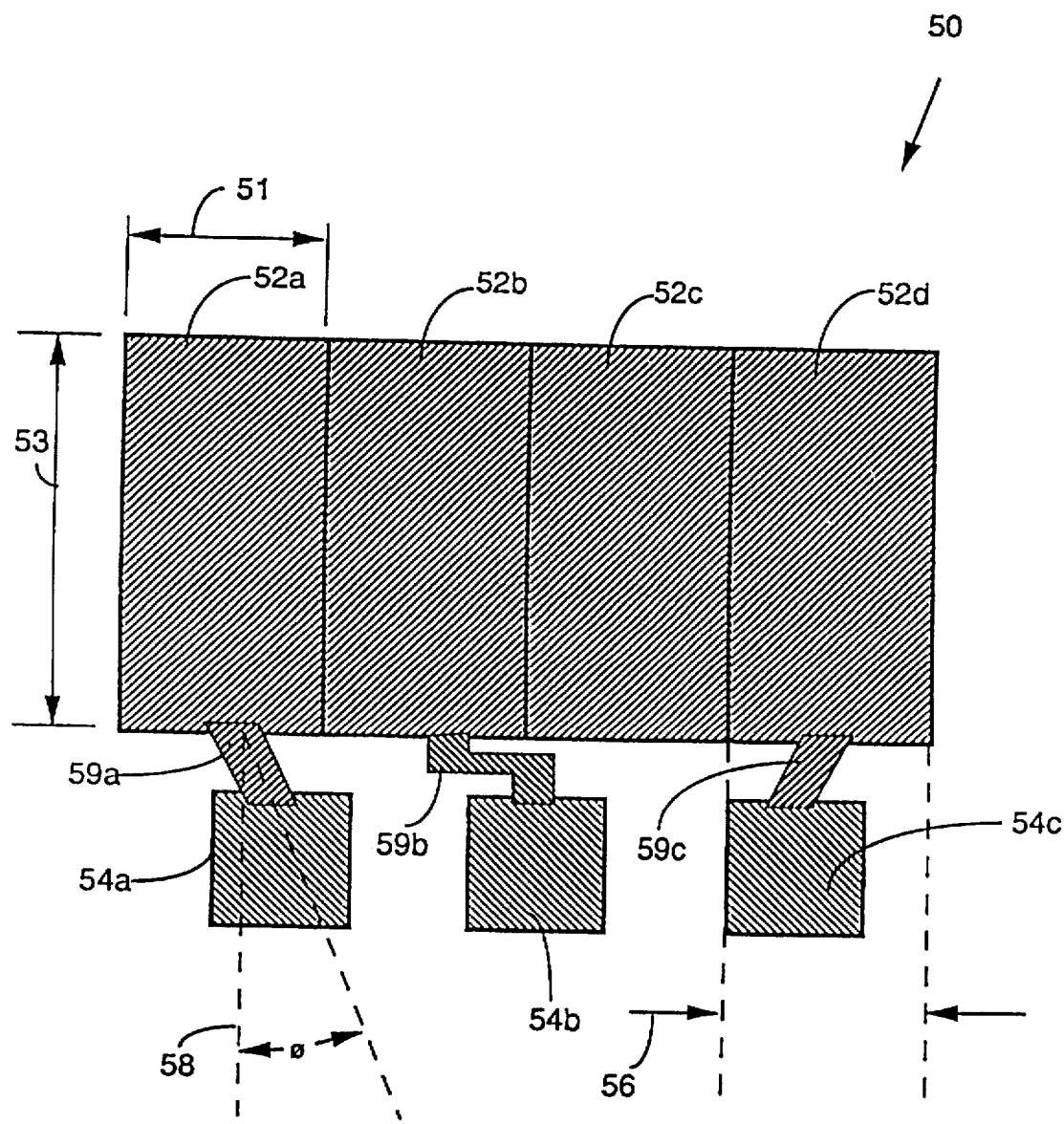
FIG. 1b is an illustration of a magnified I/O slot and pad architecture having angled and elbowed connecting wire lines.
Figure 4B:
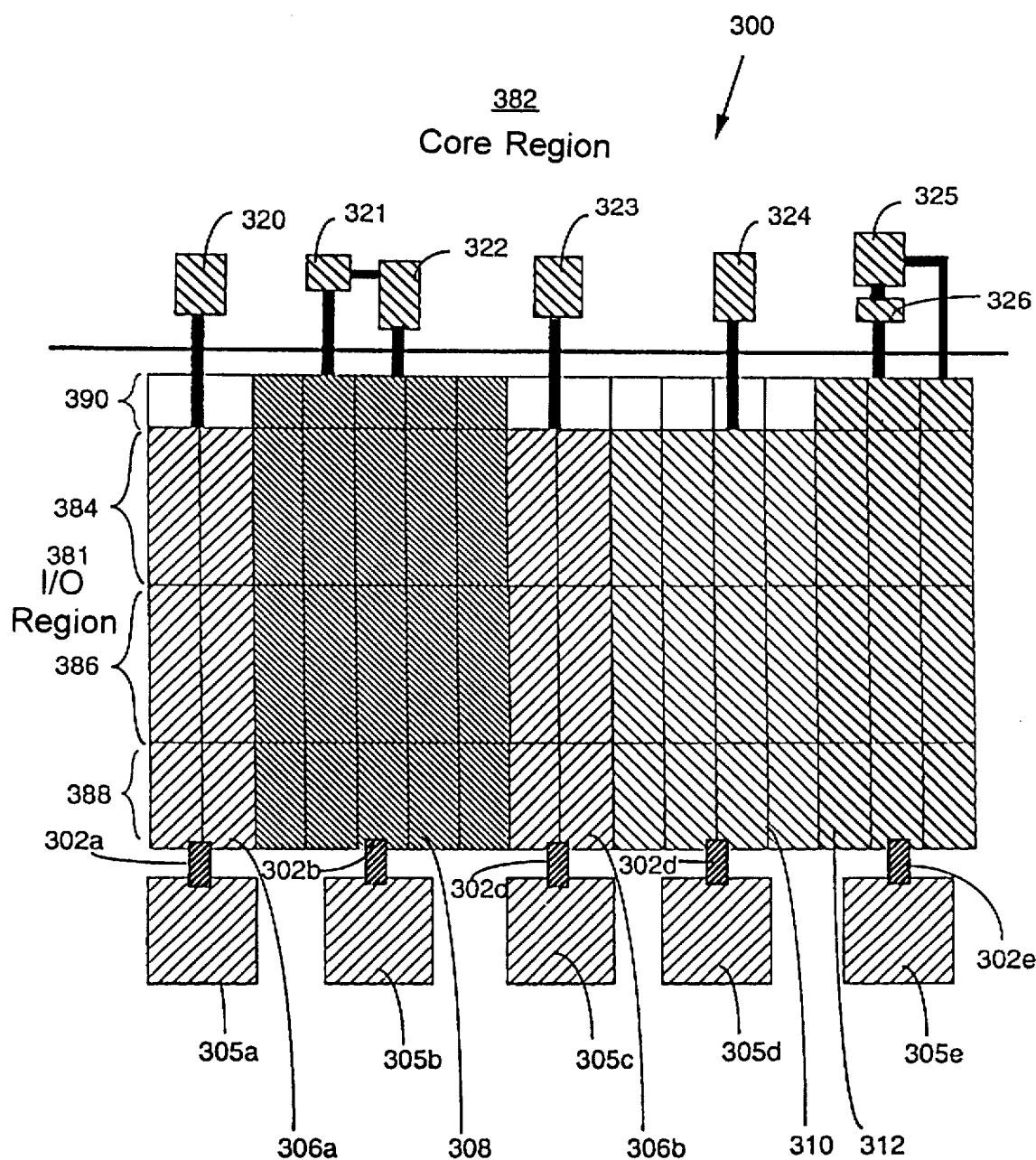
FIG. 4b is an illustration of the I/O architecture as in FIG. 4b but which utilizes available slot area more efficiently.

This is illustrated in FIG. 4b which shows an I/O architecture 300 of the present invention which utilizes all the available slot area. As shown, an I/O region 381 has five input-output circuits located within the same number of standard I/O slots shown in FIG. 4a. From left to right, input buffer 306 which utilizes two standard I/O slots is adjacent to GTL 308 which utilizes five standard I/O slots. Next to GTL 308 is a second input buffer 306' which utilizes two standard I/O slots. Adjacent to input buffer 306' is driver 310 which utilizes four standard I/O slots, and adjacent to driver 310 is differential input 312 which utilizes three standard I/O slots. As in the previously described figures, the standard I/O slot includes a special size transistor region 390, a PMOS transistor region 384, an NMOS transistor region 386 and an ESD region 388. The density of the I/O region 381 is shown to be increased since no unused standard I/O slots remains, and the input-output circuits from FIG. 4a were shifted left or right as necessary to accommodate new pad 305c. Specifically, GTL 308 was shifted to the left by one standard I/O slot, and both the driver 310 and the differential input 312 were shifted to the right by one standard I/O slot. The flexibility and efficiency of the present invention's input-output circuit placement allows for a more dense I/O region 381. Furthermore, as discussed above, the total size of a gate array masterslice is typically limited by the size of the I/O region 281, a dense I/O region 281 enables smaller overall masterslice systems. In addition, the variable pad pitch further reduces standard I/O slot waste as discussed with reference to FIG. 1b.

FIG. 4b also shows I/O pads 305a–305e being electrically coupled to their respective input-output circuits via wire connections 302a–302e. As discussed above, the I/O pads are arbitrarily spaced around the masterslice periphery depending on the placement of the input-output circuits. Also shown are blocks 320, 321, 322, 323, 324, 325, and 326 which represent I/O circuitry that has been shifted into the core region 382 as appropriate.

Figure 5A:
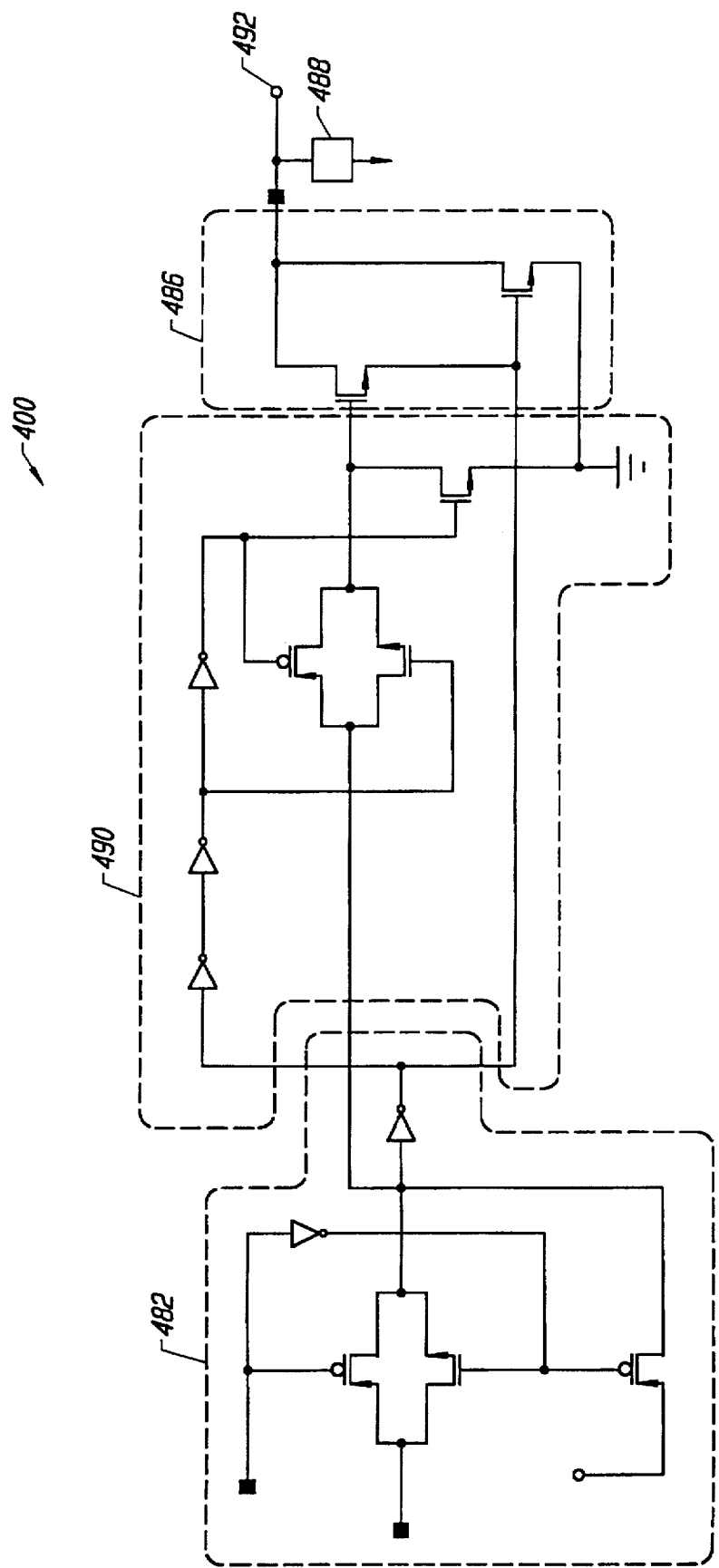
FIG. 5a is circuit diagram of an I/O gunning transceiver logic circuit divided into circuit blocks constructed on specified I/O slot regions of the present invention.

FIG. 5a is a transistor level diagram of a GTL circuit 400 depicting the location of each circuit element is constructed on standard I/O slots of the present invention. For example, the seven transistors that make up the transmission gates and inverters located in a block 482 are standard base cell transistors formed in the core region (e.g., region 82 of FIG. 2a). As explained, by moving the seven transistors into the core region frees up more transistor space in the I/O region, which in turn allows the height and width of individual standard I/O slots to be reduced. Block 490 includes special size transistors (from, e.g., region 90 of FIG. 2a) which are used to form the inverters and transmission gates shown.

Block 486 includes two transistors that are constructed on the NMOS transistor region 86 of FIG. 2a. Box 488 represents ESD circuitry, which is constructed on the ESD region 88, of FIG. 2a. As is well known to those skilled in the art, the specific complexity of the ESD circuitry is generally a question of design choice. Thus, box 488 may represent any number of ESD circuit configurations. Finally, node 492 represents a point at which an I/O pad is connected. As shown, the ESD circuitry is located proximate the I/O pad, to provide voltage surge protection right at the input.

FIG. 5b is a transistor level diagram of a basic differential input circuit 500 depicting the locations of each circuit element constructed on standard I/O slots and core region base cells of the present invention. The transistors, transmission gates and connecting busses depicted in block 582 illustrate predriver functions and logic gates that have been shifted out of the I/O region and into the core region (e.g., region 82 of FIG. 2a). The transistors depicted in block 590 are special size transistors required for tuning purposes. Thus, the transistors of block 590 are constructed on the special size transistor region 90 of FIG. 2a. The transistor in block 584 is a PMOS transistor which is constructed on the PMOS transistor region 84 of FIG. 2a. The NMOS transistor and resistors shown in block 586 are constructed on the NMOS transistor region 86, also of FIG. 2a. Black box 588, also contains ESD circuitry that is generally connected proximate an I/O pad, and node 592 is electrically coupled to an I/O pad to provide voltage surge protection at the input.

2. Method of Fabricating Masterslice I/O Architecture

Like most IC fabrication processes, the process of fabricating gate arrays of the present invention (i.e., the array of base cells in the core region, the I/O slots, and the I/O pads) generally can be divided into "front end" steps and "back end" steps. Front end steps generally include those steps necessary to form the actual transistor elements such as source/drain regions, gates, and isolation regions. Back end steps generally include those process steps necessary to create circuitry by wiring the various transistors formed by the front end processing. As applied to masterslice systems, front end processing produces the array of repeating base cells in the core region, and the various size transistors in the I/O region having the transistor layout described above, while back end processing produces the wiring to form circuits from the base cells and the I/O transistors.

In front end processing, device active regions initially are formed and electrically isolated on a single crystal semiconductor substrate. Sometime thereafter, a gate oxide layer is formed on the substrate, and then a polysilicon layer is formed on the gate oxide layer (typically by CVD deposition). The resulting polysilicon layer is doped by ion implantation, masked, and etched to form gate electrodes. A resulting gate electrode layout is characterized by an array of repeating base cells in the core region and slots in the I/O region (e.g. FIG. 1a). In this process, gate electrodes for the special size transistor region 90, the ESD region 88, the NMOS region 86, and the PMOS region 84 of FIG. 2 are formed. After the gates have been formed, source/drain regions are formed by two or more ion implantation steps. At least one of these steps will form n-type source/drain regions of NMOS devices and the other implant will form p-type source/drain regions of PMOS devices.

Typically, the NMOS transistor regions will be masked during the p-type implant and the PMOS transistor regions will be masked during the n-type implant. In this manner, the PMOS and NMOS transistor groups are formed separately in the I/O region and the base cells. After the source/drain regions have been formed, a silicide is formed on top of the polysilicon and substrate to create less resistive "ohmic" contact regions. Finally a passivation layer of, e.g., borophosphosilicate glass ("BPSG") is deposited over the entire masterslice structure. At this point, at the completion of the front end processing, the gate array structure including the I/O slot region has the potential to take on many different functions, as no circuits have yet been wired.

The back end process steps of relevance to this invention will now be described. Initially, a contact mask is formed on the passivation layer to define contact regions to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various device elements. The exact layout of the lines will be determined by the particular input output circuits required in the I/O region, and the particular ASIC design desired in the core region. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above. In some cases, it may be necessary to form and pattern one or more additional metallization layers to complete the required wiring for input-output and core region circuits.

3. Conclusion

Although the preferred embodiments of the present invention has been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A gate array masterslice formed on a semiconductor substrate, the gate array masterslice comprising:
   (a) a plurality of identical input/output slots, each of said input/output slots having;
      (i) a first region containing a plurality of tuning transistors of different physical sizes;
      (ii) a second region having one or more PMOS transistors, each of a physical size greater than any one of said plurality of tuning transistors;
      (iii) a third region having one or more NMOS transistors, each of a physical size greater than any one of said plurality of tuning transistors;
      (iv) a fourth region containing one or more devices for providing electrostatic discharge protection; and
   (b) a plurality of bonding pads, at least some of which are electrically connected to at least some of said input/output slots, wherein said plurality of bonding pads have a variable bonding pad pitch, and wherein the first region, the second region, the third region and the fourth region are contiguous to one another and the fourth region is closest to a bonding pad of the plurality of bonding pads.

2. The gate array masterslice of claim 1, wherein the variable pad pitch of the plurality of bonding pads varies arbitrarily from pad-to-pad.

3. The gate array masterslice of claim 1, wherein at least some of said bonding pads are electrically connected to input/output circuits that are formed on multiple adjacent input/output slots.

4. The gate array masterslice of claim 1, wherein all of said bonding pads are provided proximate a perimeter of said semiconductor substrate.

5. The gate array masterslice of claim 1, wherein at least some of said bonding pads are provided interior to a perimeter of said semiconductor substrate.

6. The gate array masterslice of claim 1, wherein said plurality of tuning transistors includes at least a first transistor and a second transistor having different gate widths and at least a third transistor and a fourth transistor having different gate lengths.

7. The gate array masterslice of claim 1, further comprising a core region having a plurality of identical base cells, each of which contains multiple transistors of no more than a defined gate length and no more than a defined gate width, wherein each transistor in the first, second, and third regions of said input/output slots has either (i) a gate width that is greater than said defined gate width, (ii) a gate length that is greater than said defined gate length, or (iii) both.

8. The gate array masterslice of claim 1, wherein at least some of said bonding pads are electrically connected to input/output circuits having at least some transistors located in said core region.

9. The gate array masterslice of claim 8, wherein those transistors of the input/output circuits located in the core region are located proximate said plurality of identical input/output slots.

10. The gate array masterslice of claim 1, wherein each of said second and third regions of the plurality of input/output slots contains four or fewer transistors.

11. A gate array masterslice formed on a semiconductor substrate, comprising:
   (a) a core region having a plurality of identical base cells, each of which contains multiple transistors;
   (b) a plurality of identical input/output slots, each of said input/output slots having;
      (i) a first region adjacent said core region and containing a plurality of tuning transistors of different physical sizes;
      (ii) a second region adjacent to said first region, and containing at most four PMOS transistors, each of a physical size greater than any one of said plurality of tuning transistors;
      (iii) a third region adjacent to said second region, and containing at most four NMOS transistors, each of a physical size greater than any one of said plurality of tuning transistors; and
      (iv) a fourth region adjacent to said third region, and containing one or more devices for providing electrostatic discharge protection; and
   (c) a plurality of bonding pads, at least some of which are electrically connected to at least some of said input/output slots, wherein the first region, the second region, the third region and the fourth region are contiguous with one another.

12. The gate array masterslice of claim 11, wherein at least some of said bonding pads are electrically connected to input/output circuits that are formed on multiple adjacent input/output slots.

13. The gate array masterslice of claim 11, wherein all of said bonding pads are provided proximate a perimeter of the semiconductor substrate.

14. The gate array masterslice of claim 11, wherein said bonding pads are arranged in multiple rows in a staggered formation.

15. The gate array masterslice of claim 11, wherein at least some of said bonding pads are provided interior to a perimeter of said semiconductor substrate.

16. The gate array masterslice of claim 11, wherein said plurality of tuning transistors includes at least a first transistor and a second transistor having different gate widths and at least a third transistor and fourth transistor having different gate lengths.

17. The gate array masterslice of claim 11, wherein the transistors of each base cell have of no more than a defined gate length and no more than a defined gate width, wherein each transistor in the first, second, and third regions of said input/output slots has either (i) a gate width that is greater than said defined gate width, (ii) a gate length that is greater than said defined gate length, or (iii) both.

18. The gate array masterslice of claim 11, wherein at least some of said bonding pads are electrically connected to input/output circuits having at least some transistors located in said core region.

19. The gate array masterslice of claim 18, wherein those transistors of the input/output circuits located in the core region are located proximate said plurality of identical input/output slots.

20. The gate array masterslice of claim 11 wherein the plurality of bonding pads have a variable bonding pad pitch.

21. A gate array masterslice formed on a semiconductor substrate, comprising:
   (a) a core region having a plurality of identical base cells, each of which contains multiple transistors of no more than a defined gate length and no more than a defined gate width;
   (b) a plurality of identical input/output slots, each of said input/output slots having;
      (i) a first region adjacent to said core region, and containing a plurality of tuning transistors of different physical sizes;
      (ii) a second region adjacent to said first region, and having one or more PMOS transistors, each of a physical size greater than any one of said plurality of tuning transistors;
      (iii) a third region adjacent to said second region, and having one or more NMOS transistors, each of a physical size greater than any one of said plurality of tuning transistors; and
      (iv) a fourth region adjacent to said third region, and containing one or more devices for providing electrostatic discharge protection; and
   (c) a plurality of bonding pads, at least some of which are electrically connected to at least some of said input/output slots, wherein each transistor in the first, second, and third regions of said input/output slots has either (i) a gate width that is greater than said defined gate width, (ii) a gate length that is greater than said defined gate length, or (iii) both, and wherein the first, second, third and fourth regions are contiguous with one another.

22. The gate array masterslice of claim 21, wherein at least some of said bonding pads are electrically connected to input/output circuits that are contained in multiple adjacent input/output slots.

23. The gate array masterslice of claim 21, wherein all of said bonding pads are provided proximate the semiconductor substrate periphery.

24. The gate array masterslice of claim 21, wherein at least some of said bonding pads are provided interior to said semiconductor substrate.

25. The gate array masterslice of claim 21, wherein said plurality of tuning transistors includes some transistors which vary in gate width and other transistors which vary in gate length.

26. The gate array masterslice of claim 21, wherein at least some of said bonding pads are electrically connected to input/output circuits having at least some transistors located in said core region.

27. The gate array masterslice of claim 26, wherein those transistors of the input/output circuits located in the core region are located proximate said plurality of identical input/output slots.

28. The gate array masterslice of claim 21, wherein each of said second and third regions of the plurality of input/output slots contains four or fewer transistors.

29. A method of fabricating a gate array masterslice formed on a semiconductor substrate, the method comprising the steps of:
   (a) forming a plurality of identical input/output slots on said semiconductor substrate, each of said input/output slots made by;
      (i) forming a first region containing a plurality of tuning transistors of different physical sizes;
      (ii) forming a second region having one or more PMOS transistors, each of a physical size greater than any one of said plurality of tuning transistors;
      (iii) forming a third region having one or more NMOS transistors, each of a physical size greater than any one of said plurality of tuning transistors;
      (iv) forming a fourth region containing one or more devices for providing electrostatic discharge protection;
   (b) forming a plurality of bonding pads separated from one another by a variable pad pitch, wherein the first, second, third and fourth regions are formed contiguous with one another, and the fourth region is closest to a bonding pad of the plurality of bonding pads.

30. The method of claim 29, wherein the plurality of bonding pads are formed such that the variable pad pitch of the plurality of bonding pads varies arbitrarily from pad-to-pad.

31. The method of claim 29, wherein all of said bonding pads are formed proximate a periphery of said semiconductor substrate.

32. The method of claim 29, wherein said bonding pads are arranged in multiple rows in a staggered formation.

33. The method of claim 29, wherein at least some of said bonding pads are formed interior to a periphery of said semiconductor substrate.

34. The method claim 29, wherein said plurality of tuning transistors are formed such that some transistors vary in gate width and other transistors which vary in gate length.

35. The method of claim 29 further comprising a step of forming electrical connections between at least some of the transistors in the input/output slots to create input/output circuits.

36. The method of claim 34 wherein electrical connections are also formed between at least some transistors in the input/output slots and other transistors in a core region of the gate array masterslice, the core region having a plurality of identical base cells, each of which contains multiple transistors of no more than a defined gate length and no more than a defined gate width.

37. The method of claim 34 wherein each transistor in the first, second, and third regions of said input/output slots is formed with either (i) a gate width that is greater than said defined gate width, (ii) a gate length that is greater than said defined gate length, or (iii) both.

38. The method of making a gate array masterslice of claim 29, wherein each of said second and third regions of the plurality of input/output slots is formed with four or fewer transistors.

39. A gate array masterslice formed on a semiconductor substrate, the gate array masterslice comprising:
(a) a plurality of identical input/output slots, each of said input/output slots having;
 (i) a first region containing a plurality of tuning transistors of different physical sizes;
 (ii) a second region having one or more PMOS transistors, each of a physical size greater than any one of said plurality of tuning transistors;
 (iii) a third region having one or more NMOS transistors, each of a physical size greater than any one of said plurality of tuning transistors, and each of said second and third regions of the plurality of input/output slots contains four or fewer transistors;
 (iv) a fourth region containing one or more devices for providing electrostatic discharge protection; and (b) a plurality of bonding pads, at least some of which are electrically connected to at least some of said input/output slots, wherein said plurality of bonding pads have a variable bonding pad pitch, and wherein the first region, the second region, the third region and the fourth region are contiguous to one another.

40. The gate array masterslice of claim 39, wherein the variable pad pitch of the plurality of bonding pads varies arbitrarily from pad-to-pad.

41. The gate array masterslice of claim 39, wherein at least some of said bonding pads are electrically connected to input/output circuits that are formed on multiple adjacent input/output slots.

42. The gate array masterslice of claim 39, wherein all of said bonding pads are provided proximate a perimeter of said semiconductor substrate.

43. A method of fabricating a gate array masterslice formed on a semiconductor substrate, the method comprising the steps of
(a) forming a plurality of identical input/output slots on said semiconductor substrate, each of said input/output slots made by;
 (i) forming a first region containing a plurality of tuning transistors of different physical sizes;
 (ii) forming a second region having one or more PMOS transistors, each of a physical size greater than any one of said plurality of tuning transistors;
 (iii) forming a third region having one or more NMOS transistors, each of a physical size greater than any one of said plurality of tuning transistors, and each of said second and third regions of the plurality of input/output slots is formed with four or fewer transistors;
 (iv) forming a fourth region containing one or more devices for providing electrostatic discharge protection;
(b) forming a plurality of bonding pads separated from one another by a variable pad pitch, wherein the first, second, third and fourth regions are formed contiguous with one another.

44. The method of claim 43, wherein the plurality of bonding pads are formed such that the variable pad pitch of the plurality of bonding pads varies arbitrarily from pad-to-pad.

45. The method of claim 43, wherein all of said bonding pads are formed proximate a periphery of said semiconductor substrate.

46. The method of claim 43, wherein said bonding pads are arranged in multiple rows in a staggered formation.

47. The method of claim 43, wherein at least some of said bonding pads are formed interior to a periphery of said semiconductor substrate.

* * * * *